US008451666B2

(12) United States Patent  
Perner

(10) Patent No.: US 8,451,666 B2
(45) Date of Patent: May 28, 2013

(54) READING A MEMORY ELEMENT WITHIN A CROSSBAR ARRAY

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 312 days.

(21) Appl. No.: 12/787,857

(22) Filed: May 26, 2010

(65) Prior Publication Data

US 2011/0292712 A1   Dec. 1, 2011

(51) Int. Cl.
*G11C 7/00* (2006.01)
*G11C 7/22* (2006.01)

(52) U.S. Cl.
USPC .................................. 365/189.011; 365/148

(58) Field of Classification Search
USPC ............ 365/148, 158, 163, 171, 173, 189.05, 365/189.011
See application file for complete search history.

(56) References Cited

U.S. PATENT DOCUMENTS

| 6,982,909 | B2 * | 1/2006 | Perner et al. ............. 365/189.07 |
| 7,277,319 | B2 | 10/2007 | Perner et al. |
| 7,342,840 | B2 | 3/2008 | Tran |
| 7,372,753 | B1 * | 5/2008 | Rinerson et al. ............. 365/209 |
| 7,535,754 | B2 | 5/2009 | Perner et al. |
| 2009/0016106 | A1 | 1/2009 | Tran et al. |
| 2009/0037652 | A1 * | 2/2009 | Yu et al. ......................... 711/103 |

OTHER PUBLICATIONS

Jakob Mustafa, et al.; "A Novel Reference Scheme for Reading Passive Resistive Crossbar Memories"; http://ieeexplore.ieee.org/Xplore/login.jsp?url=http://ieeexplore.ieee.org/iel5/7729/4011917/04011934.pdf%3Farnumber%3D4011934&authDecision=-203; IEEE Transactions on Nanotechnology; vol. 5, No. 6.; Nov. 2006.

* cited by examiner

*Primary Examiner* — Alexander Sofocleous
*Assistant Examiner* — R Lance Reidlinger

(57) ABSTRACT

A method for reading a memory element within a crossbar array, the method including selecting a column line connected to a target memory element of the crossbar array by applying a supply voltage to a source follower, a gate terminal of the source follower connected to the column line; applying bias voltages to row lines of the crossbar array; storing an output voltage of the source follower in a storage element; applying a sense voltage to a row line connected to the target memory element; and outputting a difference between the voltage stored in the storage element and an output voltage of the source follower while the sense voltage is applied to the row line.

21 Claims, 7 Drawing Sheets

READING A MEMORY ELEMENT WITHIN A CROSSBAR ARRAY

STATEMENT OF GOVERNMENT INTEREST

This invention has been made with government support. The government has certain rights in the invention.

BACKGROUND

As the use of digital data increases, the demand for faster, smaller, and more efficient memory structures increases. One type of memory structure which has recently been developed is a crossbar memory structure. A crossbar memory structure includes a set of upper parallel wires which intersect a set of lower parallel wires. A programmable memory element configured to store digital data is placed at each intersection of the wires.

One type of programmable memory element which may be used is a memristive element. A memristive element is a device which changes the state of its resistance based on an applied programming condition. For example, a programming condition may be applied to change the memristive element from a high resistive state to a low resistive state or vice versa. A high resistive state may represent a digital "1" and a low resistive state may represent a digital "0".

One challenge that results from use of a crossbar memory structure is the process of reading the state of a target memory element. The state of a memory element may be determined by applying a sense voltage on one side of the target memory element. Then, the voltage measured by a sense element on the other side of the target memory element will be indicative of the state of the target memory element. However, when applying a sensing voltage to a target memory element, the voltage sensed on the other side of the target memory element is adversely affected by the unselected and half-selected memory elements within the crossbar array. Thus, it is difficult to isolate the voltage across the target memory element which is a direct result of the applied sense voltage.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
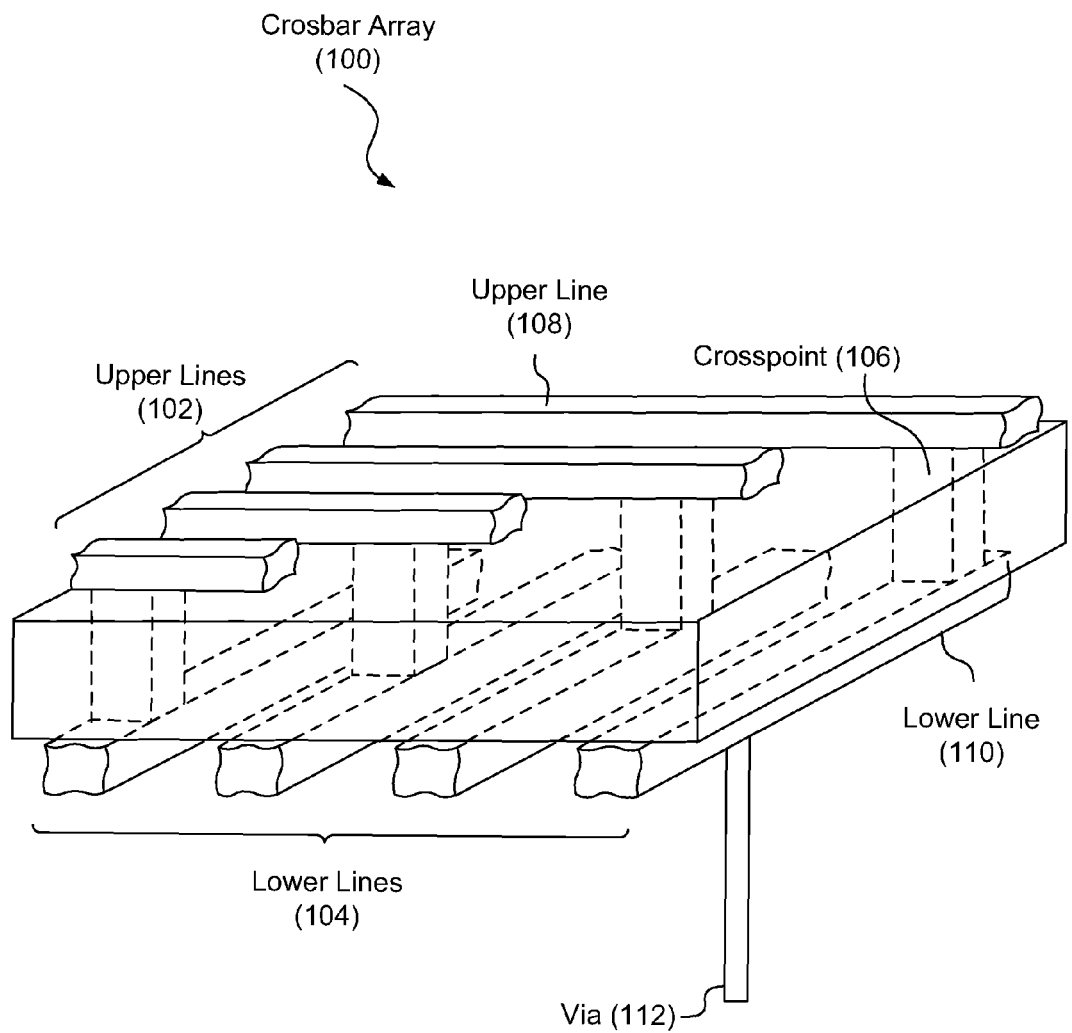
FIG. 1 is a diagram showing an illustrative crossbar array, according to one example of principles described herein.

As mentioned above, one challenge which results from use of a crossbar memory structure is the process of reading the state of a specific memory element. The state of a memory element may be determined by applying a sense voltage on one side of a target memory element. The voltage measured by a sense element on the other side of the target memory element will then be indicative of the state of the target memory element. However, when applying a sensing voltage to a target memory element, the voltage sensed on the other side of the target memory element is adversely affected by the unselected memory elements within the crossbar array. Thus, it is difficult to isolate the voltage across the target memory element which is a direct result of the applied sense voltage.

One solution has been to use isolation elements such as diodes or transistors which may selectively inhibit the flow of electric current from unselected memory elements. However, this approach requires the use of several additional electronic components for each memory element. The additional components prohibit the memory structure from being designed with a higher memory density.

In light of these and other issues, the present specification discloses a method for accurately sensing the state of a selected memory device without the need for such isolation elements. For purposes of illustration, the two sets of intersecting parallel lines will be referred to as row lines and column lines. Either the row or column lines may be the upper or lower lines.

According to certain illustrative examples, a target memory element is selected by selecting a column line connected to the target memory element and a row line connected to the target memory element. To select the column line, a supply voltage is applied to a source follower. A source follower is a transistor in which the input and output correspond to the gate terminal and the source terminal. The gate terminal of the source follower is connected to the column line that is connected to the target memory element.

Bias voltages are also applied to row lines of a crossbar array not connected to the target memory element. Because the row lines to which the bias voltages are applied intersect the column line connected to the source follower, the applied bias voltages will result in a voltage formed at the gate terminal of the source follower. The bias voltages may be designed so that they will not inadvertently change the state of the memory elements within the crossbar array and yet still be large enough to cause the gate voltage to exceed the source follower's threshold voltage. By exceeding the source follower's threshold voltage, the source follower may be brought into a saturation mode.

While in a saturation mode, the source follower transfers the voltage on the input (the gate terminal) minus the threshold voltage to the output (the source terminal) of the source follower. The input side of the source follower experiences high impedance, effectively isolating the crossbar memory elements from various sensing circuitry on the other side of the source follower.

With only the bias voltages applied to the row lines not connected to the target memory element, the voltage experienced on the output of the source follower is not indicative of the state of the target memory element. Thus, this voltage may be referred to as a background voltage. The background voltage is then stored in a storage element to be used at a later time.

A sense voltage is then applied to the selected row connected to the target memory element. At this point, the output voltage of the source follower is dependent not only on the bias voltages applied to the unselected rows, but also the sense voltage applied to the selected row line connected to the target memory element. Thus, the difference in the output voltage from before the sense voltage is applied and after the sense voltage is applied is dependent on the state of the target memory element. This difference in voltage may be determined by subtracting the background voltage stored in the storage element from the output voltage experienced when the sense voltage is being applied to the selected row.

Through use of a system or method embodying principles described herein, the state of a target memory element within a crossbar array may be determined without the need for isolation elements. Without isolation elements, a memory structure with a higher density may be realized. The higher memory density allows more data to be stored within a smaller physical amount of space.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "memory structure" is to be broadly interpreted as the physical structure of an electronic circuit designed to store digital data. A memory structure may include a number of programmable devices configured to be set to a number of different states.

Throughout this specification and in the appended claims, the term "crossbar array" is to be broadly interpreted as a number of lower wire lines intersecting a number of upper wire lines. A programmable logic device is disposed at each crosspoint between an upper wire segment and a lower wire segment.

Throughout this specification and in the appended claims, the term "memory element" is to be broadly interpreted as a component configured to be programmed with a value or state and maintain that value or state to be read at a later time.

Throughout this specification and in the appended claims, the terms "row lines" and "column lines" are used to differentiate between a first set of parallel lines intersecting a second set of parallel lines. Either the row or column lines may be the upper set of lines in any particular application.

Referring now to the figures, FIG. 1 is a diagram showing an illustrative crossbar memory architecture (100). According to certain illustrative examples, the crossbar architecture (100) may include an upper set of lines (102) which may generally be in parallel. Additionally, a lower set of lines (104) may be generally perpendicular to and intersect the upper lines (102). Programmable crosspoint devices (106) are formed at the intersections between an upper line (108) and a lower line (110).

According to certain illustrative examples, the programmable crosspoint devices (106) may be memristive devices. Memristive devices exhibit a "memory" of past electrical conditions. For example, a memristive device may include a matrix material which contains mobile dopants. These dopants can be moved within a matrix to dynamically alter the electrical operation of an electrical device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar architecture (100) may be used to form a non-volatile memory array. Non-volatile memory has the characteristic of not losing its contents when no power is being supplied. Each of the programmable crosspoint devices (106) is used to represent one or more bits of data. Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2:
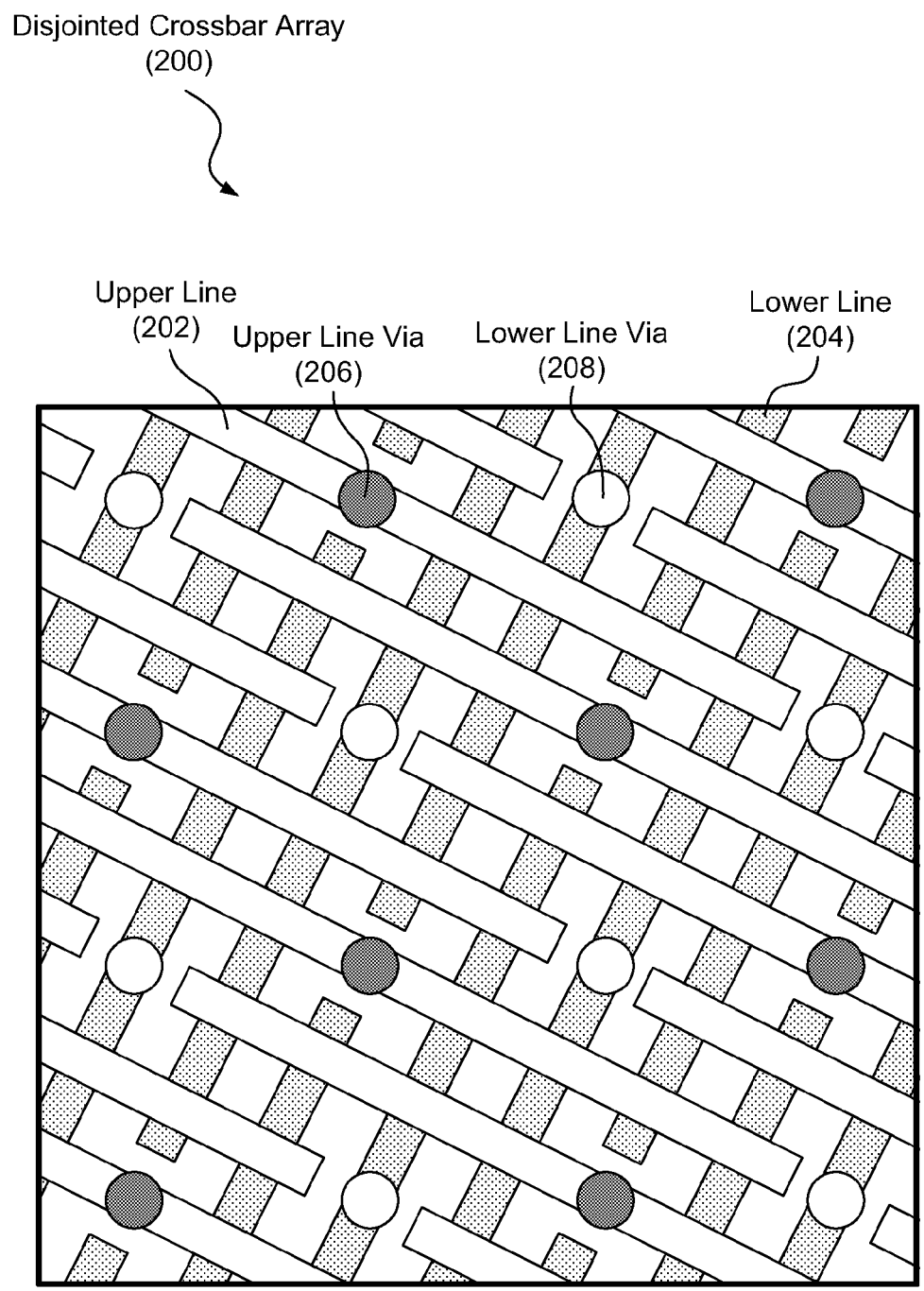
FIG. 2 is a diagram showing an illustrative disjointed crossbar array, according to one example of principles described herein.

FIG. 2 is a diagram showing an illustrative disjointed crossbar array (200). According to certain illustrative examples, a crossbar array may be structured in a disjointed manner. That is, the end crosspoints of two adjacent parallel upper lines (202) intersect different lower lines (204). In one type of disjointed crossbar array (200), the lower line vias (208) and the upper line vias (206) may each be positioned in the middle of their respective lines. Thus, the line vias (206, 208) will have an equal number of memory elements on each side. Such a crossbar structure is merely one type of crossbar structure in which the principles described herein may be used.

As mentioned above, when selecting a target memory element to be read, it is difficult to isolate the voltage which has been affected by the target memory element alone. Consequently, the present specification discloses methods and systems for reading the state of a target memory element without the need for isolation elements.

Figure 3:
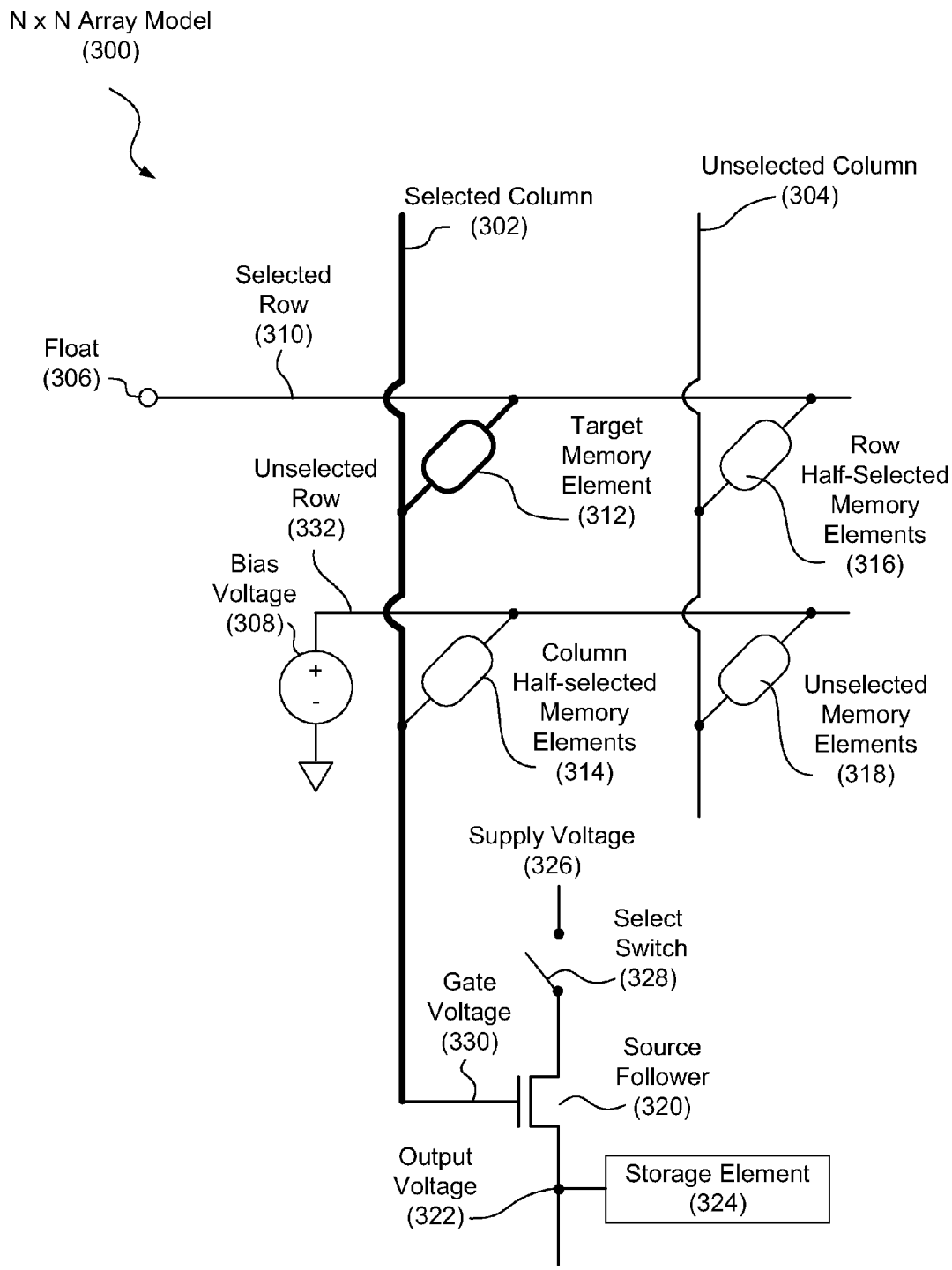
FIG. 3 is a diagram showing an illustrative N×N crossbar array model while a target memory element is half-selected, according to one example of principles described herein.

FIG. 3 is a diagram showing an illustrative N×N crossbar array model while a target memory element is half-selected. While a practical crossbar array may include a 512×512 array, a much smaller 2×2 array is shown for purposes of this explanation to more simply illustrate and model the principles of reading the state of memory elements that can be identically applied within larger arrays.

According to certain illustrative examples, each column line is connected to the gate terminal of a source follower (320). As mentioned above, a source follower (320) is a transistor in which the gate terminal and the source terminal of the transistor correspond to the input terminal and the output terminal of the source follower (320).

To select a particular column within the crossbar array (300), a select switch (328) may be closed to provide a supply voltage (326) to the drain terminal of the source follower (320) connected to the column desired to be selected. By selecting a column (302), all memory elements (312, 314) along that column become half-selected. Thus, the target memory element (312) as well as the rest of the memory elements (314) connected to the selected column (302) become half-selected.

Bias voltages (308) are then applied to the unselected rows (332) while the selected row (310) connected to the target memory element (312) is left to float (306). The bias voltages are then applied across the column half-selected memory elements (314), causing a gate voltage (330) to form at the gate terminal of the source follower (320). The value of the bias voltages (308) applied to the unselected rows (332) are such that the gate voltage (330) of the source follower (320) is greater than the threshold voltage of the source follower (320). As will be appreciated by those skilled in the relevant art, the threshold voltage for a transistor device is typically around 0.7 volts. Additionally, the bias voltages may be less than whatever value is great enough to change the state of a memory element. This may prevent the bias voltages from inadvertently rewriting a memory element during a read operation.

In some cases, all of the unselected rows (332) may have a bias voltage applied. In some cases, less than all of the unselected rows may have bias voltages applied.

If the gate voltage exceeds the threshold voltage of the source follower (320), the source follower (320) will be brought out of the cut-off mode. If the select switch (328) is closed and the supply voltage (326) is greater than the voltage across the drain terminal and the source terminal of the source follower (320) plus the output voltage (322), then the source follower (320) will be in a saturation mode. While in the saturation mode, the source follower (320) transfers the gate voltage (330) to the output voltage (322). The input side of the source follower (320) experiences high impedance, effectively isolating the crossbar memory elements from various sensing circuitry on the other side of the source follower (320). With the supply voltage (326) applied to the drain terminal of the source follower (320), the output voltage (322) will follow the gate voltage (330).

At this point, the output voltage (322) is dependent upon the bias voltages across the column half-selected memory elements (314) and is not indicative of the state of the target memory element (312). Thus, this voltage may be referred to as a background voltage. The background voltage is then stored in a storage element (324). One example of a storage element (324) is a sample and hold circuit. The background voltage stored by the storage element (324) will be used at a later time.

Figure 4:
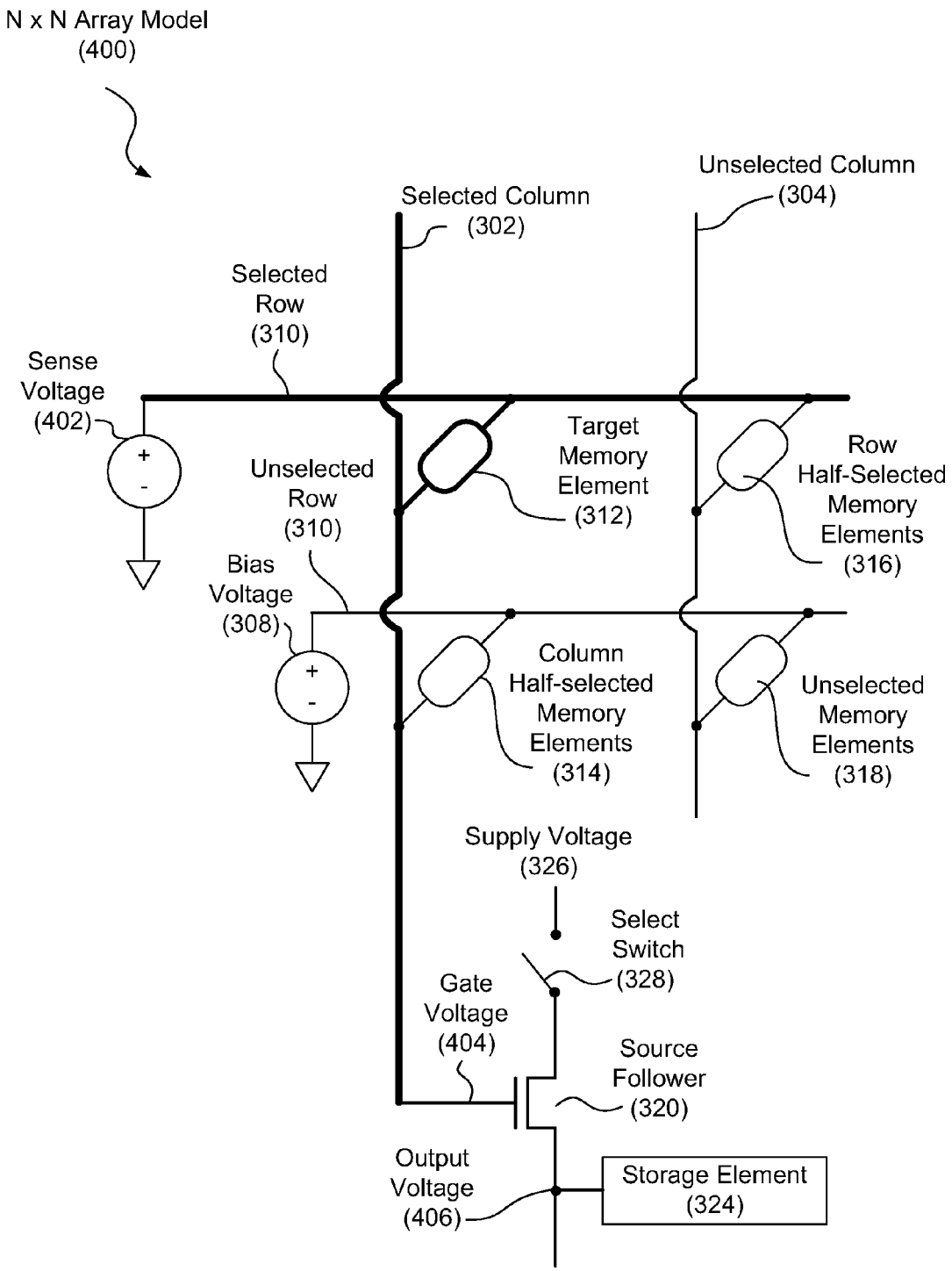
FIG. 4 is a diagram showing an illustrative N×N crossbar array model while a target memory element is fully selected, according to one example of principles described herein.

FIG. 4 is a diagram showing an illustrative N×N crossbar array model while a target memory element (312) is fully selected. In order to fully select a target memory element (312), a sense voltage (402) is applied to the row connected to the target memory element. This row may be referred to as the selected row (310). When the sense voltage (402) is applied to the selected row (310), each memory element (312, 316) along the selected row (310) experiences the sense voltage (402). Thus, the target memory element is now fully selected and the rest of the memory elements (316) along the selected row (310) become half-selected.

The gate voltage (404) of the source follower (320) is now affected by the sense voltage (402) across the target memory element (312) in addition to the bias voltages across the column unselected memory elements (314) along the selected column (302). As before, the gate voltage (404) is transferred to the output voltage (406). To determine the voltage across the target memory element (312) resulting from only the sense voltage (402), the background voltage stored in the storage element (324) may be subtracted from the output voltage experienced with the sense voltage applied. This effectively cancels out the background voltage resulting from the bias voltages and leaves only the voltage affected by the sense voltage (402) across the target memory element (312). The remaining voltage is now indicative of the state of the target memory element (312). The remaining voltage may be sensed by various sensing circuitry such as a trans-impedance amplifier.

Figure 5:
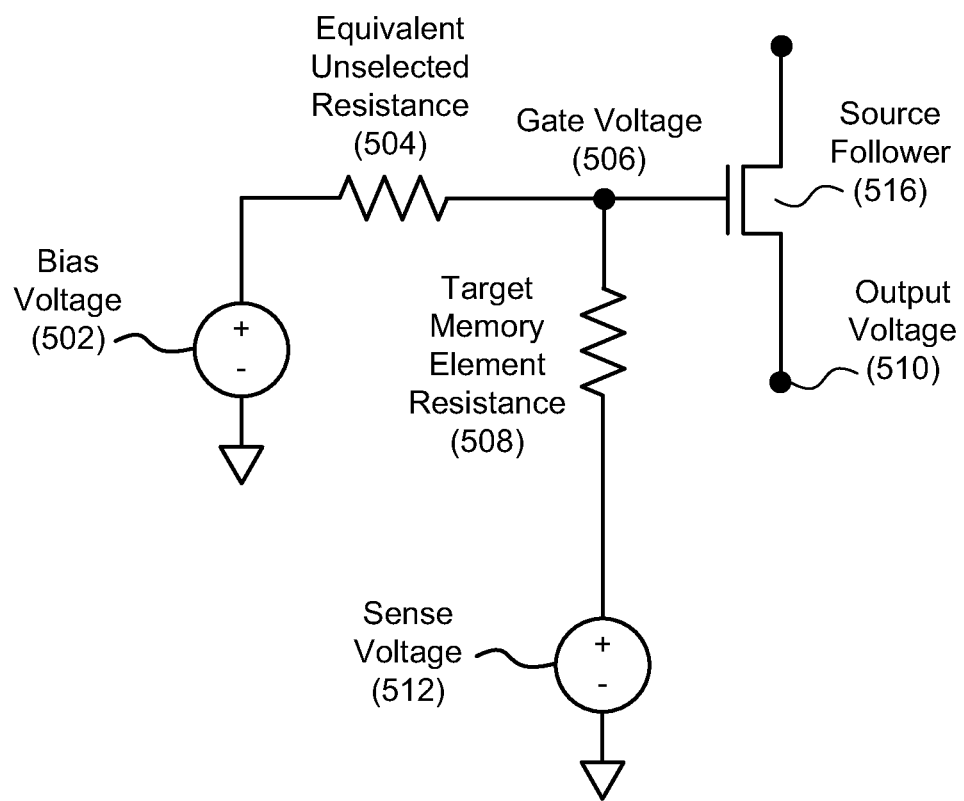
FIG. 5 is a diagram showing an illustrative circuit schematic of an equivalent circuit of a fully selected memory element of a crossbar array, according to one example of principles described herein.

FIG. 5 is a diagram showing an illustrative circuit schematic (500) of an equivalent circuit of a fully selected memory element of a crossbar array. According to certain illustrative examples, the selected memory element resistance (508) and the unselected memory elements equivalent resistance (504) form a voltage divider circuit. A voltage divider circuit is one in which an input voltage is applied across two resistances and an output voltage is between the two resistances. The input voltage is divided across each resistance based on the value of the resistances. Thus, the output voltage is the voltage across only one of the resistances.

As mentioned above, the gate voltage (506) of the source follower (516) is dependent upon the bias voltages applied to the unselected rows and the sense voltage applied to the selected row. The gate voltage (506) is also dependent upon the equivalent resistance (504) of the unselected memory elements within the crossbar array as well as the bias voltage (502) and sense voltage (512). The equivalent unselected resistance (504) is dependent upon the resistive state of the half-selected and unselected memory elements within the crossbar array. As will be appreciated by one skilled in the relevant art, the equation for the gate voltage is as follows:

$$V_G = V_S + (V_B - V_S) * R_{TAR} / (R_{TAR} + R_{EQ})$$ (Eq. 1)

In which:
$V_G$=the gate voltage (506);
$V_S$=the sense voltage (512);
$V_B$=the bias voltage (502);
$R_{TAR}$=the target memory element resistance (508); and
$R_{EQ}$=the equivalent unselected and half-selected resistance (504).

As will be apparent to one skilled in the relevant art, the selected memory element has a relatively significant effect on the gate voltage. Thus, by determining the gate voltage with and without the sense voltage (512) applied to the selected memory element, the relative resistive state of the target memory element may be determined. As mentioned above, the difference in gate voltage is transferred to the output voltage (510) of the source follower (516). The output voltage may then be measured or sensed by various sensing circuitry.

Data is typically stored in a digital format. In a digital format, only two discrete values are represented; a digital '1' and a digital '0'. The resistive state of a memory element may represent either a '1' or a '0'. For example, a high resistive state may represent a '0' and a low resistive state may represent a '1' or vice versa. In some cases, the difference between a high resistive state and a low resistive state may be a factor of 100 or more. For example, if a memory element is in a low resistive state, it may have a resistance of 100 ohms. In a high resistive state, the memory element may have a resistance of 10,000 ohms. Thus, it may not be necessary to determine the exact resistance of a target memory element. Rather, the relative resistance may be sufficient to determine whether the target memory element is representing a digital '1' or a digital '0'.

Figure 6:
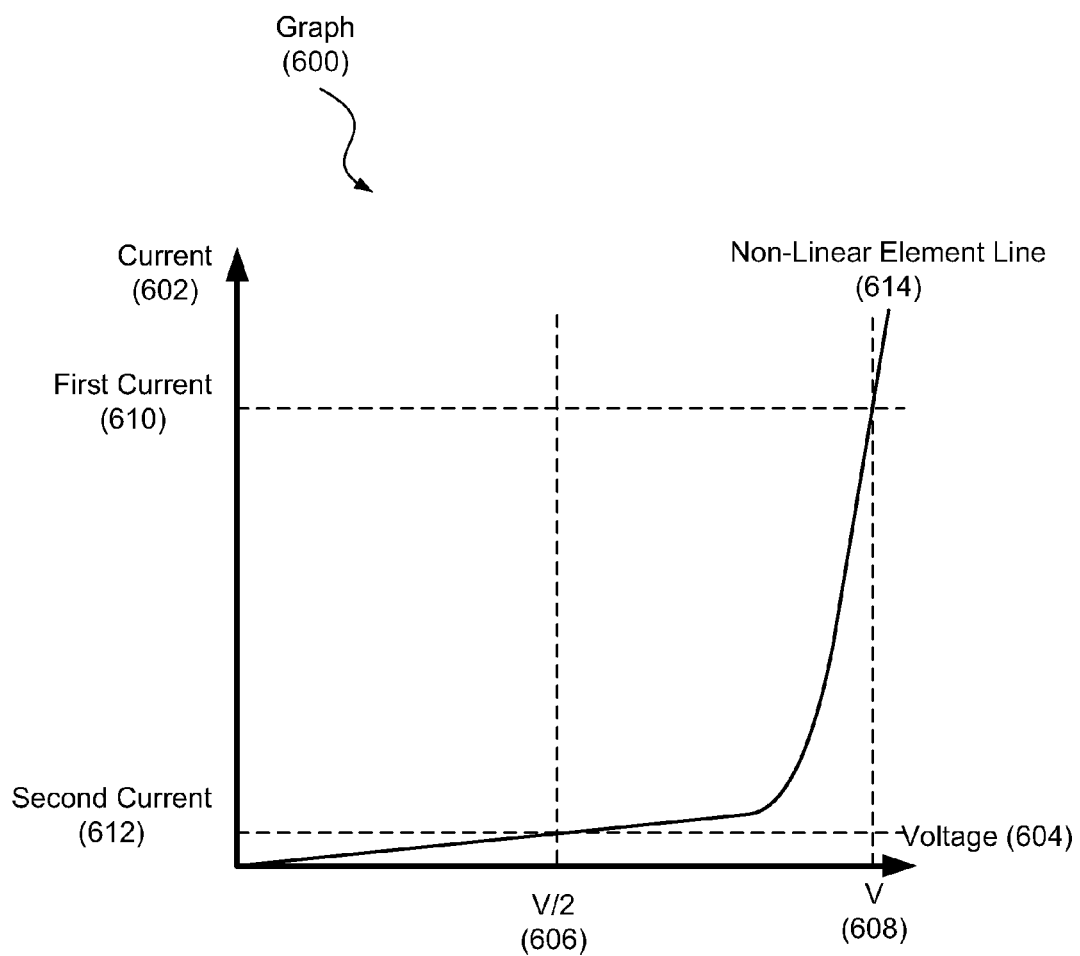
FIG. 6 is a diagram showing an illustrative voltage to current relation of a non-linear element, according to one example of principles described herein.

FIG. 6 is a graph (600) showing an illustrative voltage to current relation of a non-linear element. The horizontal axis of the graph (600) represents voltage (604) and the vertical axis of the graph (600) represents electric current (602). The non-linear element line (614) indicates the electric current (602) passing through a non-linear resistive element as a function of voltage (604).

According to certain illustrative examples, a voltage V (608) may be applied to a non-linear element. A first electric current (610) illustrated by the upper horizontal dotted line is the electric current value passing through the non-linear element with a voltage of V (608) applied. If half the voltage, V/2, (606) is applied, a second electric current (612) illustrated by the lower horizontal dotted line will flow through the non-linear element. The second current (612) will be much smaller than half the first electric current (610) flowing through the non-linear element when V (608) is applied. This non-linear relationship allows bias voltages to be applied to unselected lines within the crossbar array without overly affecting the electric current sensed from a selected memory element.

For example, if a sense voltage of V (604) is applied to a selected line and a bias voltage of V/2 (606) is applied to unselected lines, the cumulative electric currents from several unselected lines may still be less than the electric current flowing through the selected memory element as a result of sense voltage V (608) being applied.

Figure 7:
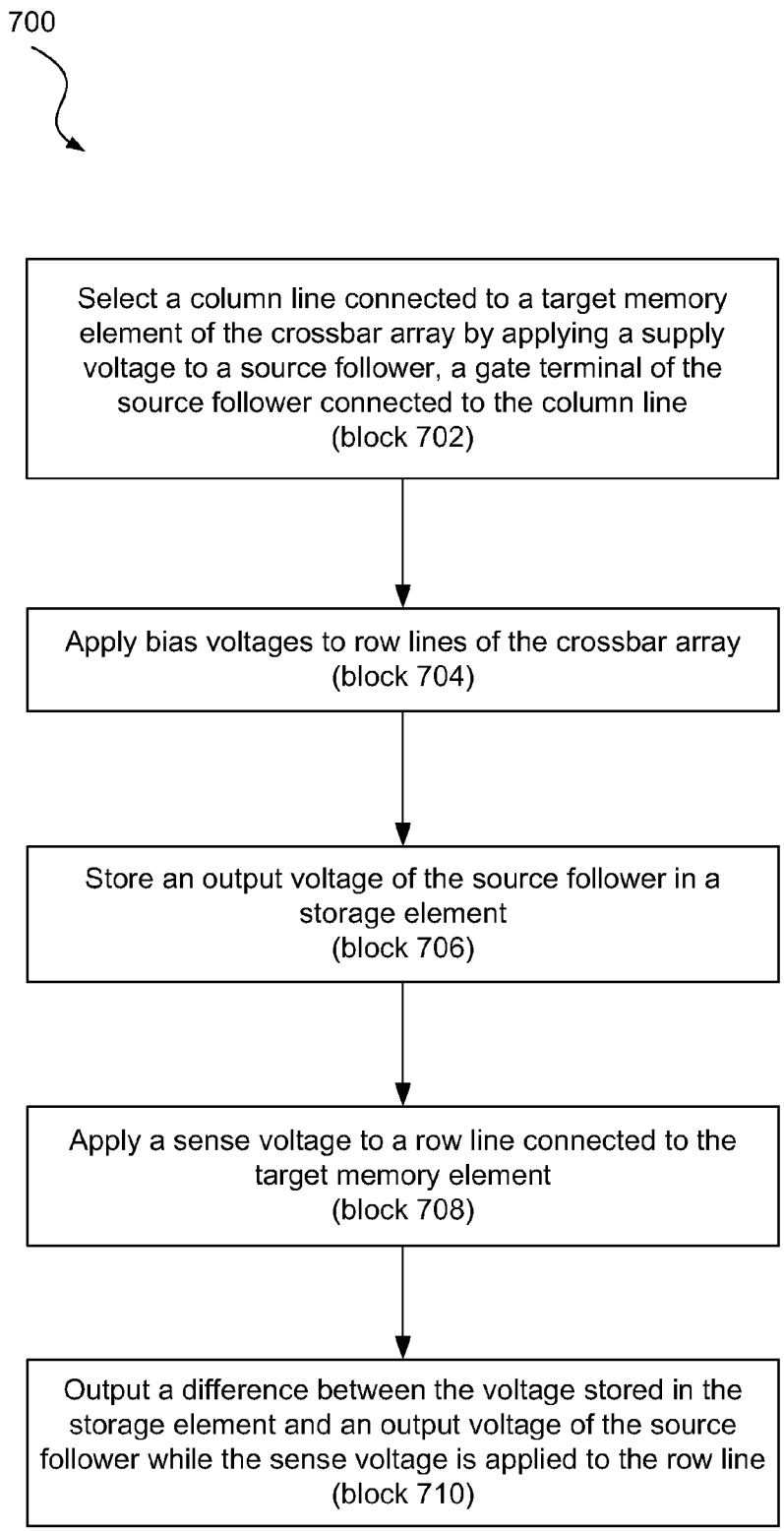
FIG. 7 is a flowchart showing an illustrative method for using a voltage to sense the state of a memory element within a crossbar array, according to one example of principles described herein.

FIG. 7 is a flowchart showing an illustrative method for using a voltage to sense the state of a memory element within a crossbar array. According to certain illustrative examples, the method may include selecting (block 702) a column line connected to a target memory element of the crossbar array by applying a supply voltage to a source follower, a gate terminal of the source follower connected to the column line; applying (block 704) bias voltages to row lines of the crossbar array; storing (block 706) an output voltage of the source follower in a storage element; applying (block 708) a sense voltage to a row line connected to the target memory element; and outputting (block 710) a difference between the voltage stored in the storage element and an output voltage of the source follower while the sense voltage is applied to the row line.

In sum, through use of a system or method embodying principles described herein, the state of a target memory element within a crossbar array may be determined without the need for isolation elements. Without isolation elements, a memory structure with a higher density may be realized. The higher memory density allows more data to be stored within a smaller physical amount of space.

The preceding description has been presented only to illustrate and describe examples and examples of the principles described. This description is not intended to be exhaustive or to limit these principles to any precise form disclosed. Many modifications and variations are possible in light of the above teaching.

What is claimed is:

1. A crossbar array comprising:
   a number of parallel row lines intersecting a set of parallel column lines; and
   a memory element at each intersection of a row line and a column line,
   said crossbar array further comprising circuitry to:
   select one of said column lines connected to a target memory element of said crossbar array by applying a supply voltage to a source follower, where a gate terminal of said source follower is connected to said selected column line;
   apply bias voltages to said row lines of said crossbar array;
   store an output voltage of said source follower in a storage element;
   then, apply a sense voltage to said selected row line connected to said target memory element; and
   output a difference between said voltage stored in said storage element and an output voltage of said source follower while said sense voltage is applied to said selected row line.

2. The crossbar array of claim 1, in which said storage element comprises a sample and hold circuit.

3. The crossbar array of claim 1, in which said bias voltages applied to said row lines cause a gate voltage of said source follower to bring said source follower into a saturation mode.

4. The crossbar array of claim 1, in which said crossbar array is a disjointed crossbar array.

5. The crossbar array of claim 1, in which memory elements within said crossbar array comprise non-linear resistive elements.

6. The crossbar array of claim 5, in which said non-linear resistive memory elements within said crossbar array comprise memristive elements.

7. The crossbar array of claim 1, in which said circuitry determines a resistive state of said target memory element based on said difference between said voltage stored in said storage element and an output voltage of said source follower while said sense voltage is applied to said one of said row lines.

8. The crossbar array of claim 1, wherein said circuitry, when applying bias voltages to said row lines, does not apply a bias voltage to said selected column line, but allows said selected column line to float.

9. A system for reading memory elements within a crossbar array, said crossbar array comprising a set of parallel row lines intersecting a set of parallel column lines, memory elements being disposed at intersections between said row lines and said column lines, the system comprising:
   a source follower, a gate terminal of said source follower connected to one of said column lines;
   switching devices connecting bias voltage supplies to said row lines;
   a storage element to store an output voltage of said source follower;
   a sense voltage supply to apply a sense voltage to one of said row lines; and
   an output to provide a final voltage, said final voltage comprising an output of said source follower with said sense voltage applied to one of said row lines minus a voltage stored in said storage element.

10. The system of claim 9, in which said bias voltages connected to said row lines apply bias voltages to said row lines to cause a gate voltage of said source follower to bring said source follower into a saturation mode.

11. The system of claim 9, in which said crossbar array is a disjointed crossbar array.

12. The system of claim 9, in which memory elements within said crossbar array comprise non-linear resistive elements.

13. The system of claim 12, in which said non-linear resistive memory elements within said crossbar array comprise memristive elements.

14. The system of claim 9, further comprising a sense element, said sense element to determine a resistive state of a target memory element intersecting said one of said column lines and said one of said row lines based on said final voltage.

15. A method for reading a memory element within a crossbar array, the method comprising:
   selecting a column line connected to a target memory element of said crossbar array by applying a supply voltage to a source follower, a gate terminal of said source follower connected to said column line;
   applying bias voltages to row lines of said crossbar array;
   storing an output voltage of said source follower in a storage element;
   applying a sense voltage to a row line connected to said target memory element; and
   outputting a difference between said voltage stored in said storage element and an output voltage of said source follower while said sense voltage is applied to said row line.

16. The method of claim 15, in which said bias voltages applied to said row lines cause a gate voltage of said source follower to bring said source follower into a saturation mode.

17. The method of claim 15, in which said crossbar array is a disjointed crossbar array.

18. The method of claim 15, in which memory elements within said crossbar array comprise non-linear resistive elements.

19. The method of claim 18, in which said non-linear resistive memory elements within said crossbar array comprise memristive elements.

20. The method of claim 15, further comprising, determining a resistive state of said target memory element based on said difference between said voltage stored in said storage element and said output voltage of said source follower when said sense voltage is applied to said row line.

21. The method of claim 15, in which said storage element comprises a sample and hold circuit.

\* \* \* \* \*

UNITED STATES PATENT AND TRADEMARK OFFICE
CERTIFICATE OF CORRECTION

| | | |
|---|---|---|
| PATENT NO. | : 8,451,666 B2 | Page 1 of 1 |
| APPLICATION NO. | : 12/787857 | |
| DATED | : May 28, 2013 | |
| INVENTOR(S) | : Frederick Perner | |

It is certified that error appears in the above-identified patent and that said Letters Patent is hereby corrected as shown below:

In the Claims

In column 7, line 65, in Claim 1, delete "comprising;" and insert -- comprising: --, therefor.

Signed and Sealed this
Fifth Day of November, 2013

Teresa Stanek Rea
*Deputy Director of the United States Patent and Trademark Office*